(12) United States Patent
Lee et al.

(10) Patent No.: US 9,129,852 B1
(45) Date of Patent: Sep. 8, 2015

(54) METHOD FOR FABRICATING NON-VOLATILE MEMORY SEMICONDUCTOR DEVICE

(71) Applicant: UNITED MICROELECTRONICS CORP., Hsin-Chu (TW)

(72) Inventors: Hsiang-Chen Lee, Kaohsiung (TW); Shao-Nung Huang, Tainan (TW); Wei-Pin Huang, Kaohsiung (TW); Kuo-Lung Li, Yunlin County (TW); Ling-Hsiu Chou, Tainan (TW); Ping-Chia Shih, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/457,107

(22) Filed: Aug. 11, 2014

(51) Int. Cl.
*H01L 29/788* (2006.01)
*H01L 27/115* (2006.01)

(52) U.S. Cl.
CPC ........ *H01L 27/115* (2013.01); *H01L 27/11524* (2013.01)

(58) Field of Classification Search
CPC .................... H01L 27/115; H01L 27/11524
USPC ............................................ 257/315
See application file for complete search history.

(56) References Cited

U.S. PATENT DOCUMENTS

| 2006/0017092 A1* | 1/2006 | Dong et al. .............. 257/314 |
| 2008/0315281 A1* | 12/2008 | Park ...................... 257/315 |
| 2009/0003074 A1* | 1/2009 | Georgescu et al. ...... 365/185.18 |

* cited by examiner

*Primary Examiner* — David Vu
*Assistant Examiner* — Brandon Fox
(74) *Attorney, Agent, or Firm* — Winston Hsu; Scott Margo

(57) ABSTRACT

A method for fabricating a non-volatile memory semiconductor device is disclosed. The method includes the steps of providing a substrate; forming a gate pattern on the substrate, wherein the gate pattern comprises a first polysilicon layer on the substrate, an oxide-nitride-oxide (ONO) stack on the first polysilicon layer, and a second polysilicon layer on the ONO stack; forming an oxide layer on the top surface and sidewall of the gate pattern; performing a first etching process to remove part of the oxide layer; and performing a second etching process to completely remove the remaining oxide layer.

16 Claims, 3 Drawing Sheets

METHOD FOR FABRICATING NON-VOLATILE MEMORY SEMICONDUCTOR DEVICE

BACKGROUND OF THE INVENTION

1. Field of the Invention

The invention relates to a method for fabricating non-volatile memory device, and more particularly, to a method of utilizing two dry etching processes to completely remove an oxide layer from pre-defined select gate pattern of the device.

2. Description of the Prior Art

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased electrically.

Product development efforts in memory device technology have focused on increasing the programming speed, lowering programming and reading voltages, increasing data retention time, reducing cell erasure times and reducing cell dimensions. Some of the flash memory arrays today utilize agate structure made of dual polysilicon layers (also refers to as the dual poly-Si gate). The polysilicon layer utilized in these gate structures often includes a dielectric material composed of an oxide-nitride-oxide (ONO) structure. When the device is operating, electrons are injected from the substrate into the bottom layer of the dual polysilicon layers for storing data. Since these dual gate arrays typically store only one single bit of data, they are inefficient for increasing the capacity of the memory. As a result, a flash memory made of silicon-oxide-nitride-oxide-silicon (SONOS) is derived. Preferably, a transistor from these memories is capable of storing two bits of data simultaneously, which not only reduces the size of the device but also increases the capacity of the memory significantly.

Despite the common utilization of these devices, current process for fabricating flash memory typically encounters issues during the formation of select gates. For instance, oxide layer formed on the pre-defined select gate patterns is typically removed prior to the formation of actual control gates and select gates. Nevertheless, the removal of such oxide layer is often incomplete and the oxide layer remained on the sidewall of the gate pattern most likely impacts the salicide process thereafter. Hence, how to improve the current flow for fabricating flash memory device has become an important task in this field.

SUMMARY OF THE INVENTION

It is therefore an objective of the present invention to provide a method for fabricating non-volatile memory device for resolving the aforementioned issues.

According to a preferred embodiment of the present invention, a method for fabricating a non-volatile memory semiconductor device includes the steps of providing a substrate; forming a gate pattern on the substrate, wherein the gate pattern comprises a first polysilicon layer on the substrate, an oxide-nitride-oxide (ONO) stack on the first polysilicon layer, and a second polysilicon layer on the ONO stack; forming an oxide layer on the top surface and sidewall of the gate pattern; performing a first etching process to remove part of the oxide layer; and performing a second etching process to completely remove the remaining oxide layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
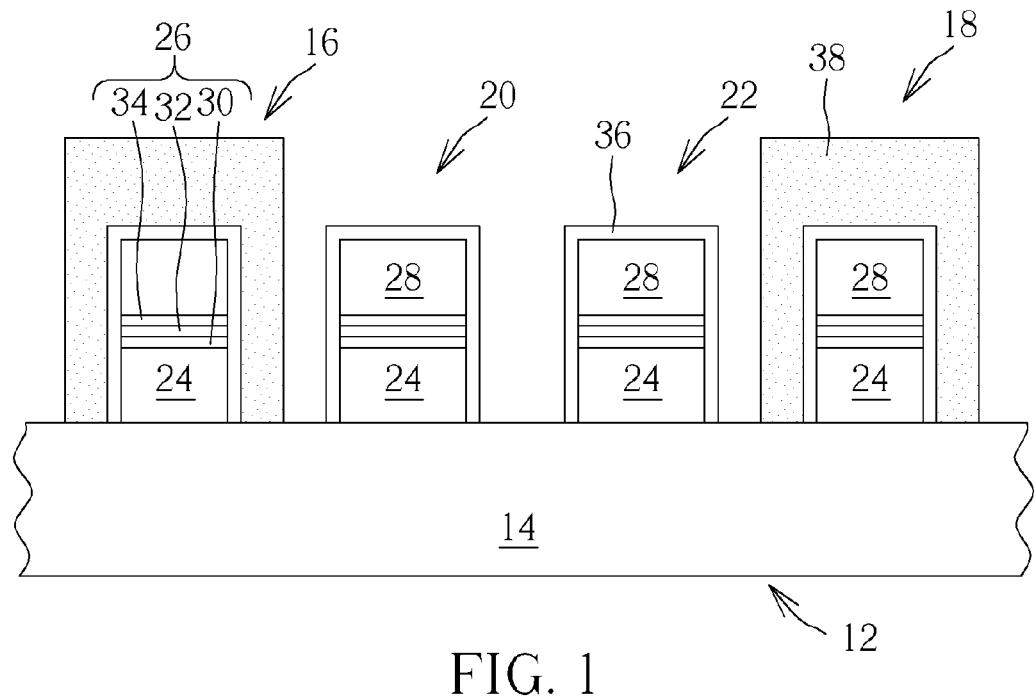
FIGS. 1-5 illustrate a method for fabricating a flash memory device according to a preferred embodiment of the present invention.

Referring to FIGS. 1-5, FIGS. 1-5 illustrate a method for fabricating a flash memory device according to a preferred embodiment of the present invention. As shown in FIG. 1, a substrate 12, such as a semiconductor substrate composed of gallium arsenide (GaAs), silicon on insulator (SOI) layer, epitaxial layer, silicon germanium layer, or other semiconductor materials is provided, in which a shallow trench isolation (STI) 14 is also formed in the substrate 12.

Next, a plurality of gate patterns 16, 18, 20, 22 are formed on the substrate 12, in which the two gate patterns 16,18 on the two sides will be formed into control gates and floating gates afterwards whereas the two gate patterns 20, 22 in the center will be formed into select gates. In this embodiment, the width or critical dimension of the gate patterns 16 and 18 are approximately 120 nm while the width of the gate patterns 20 and 22 are approximately 200 nm, but not limited thereto. Each of the gate patterns 16, 18, 20, 22 is composed of an oxide layer (not shown), a first polysilicon layer 24 on the substrate 12, an oxide-nitride-oxide (ONO) stack 26 on the first polysilicon layer 24, and a second polysilicon layer 28 on the ONO stack 26. The ONO stack 26 preferably includes a bottom oxide layer 30, a nitride layer 32, and a top oxide layer 34, in which the bottom oxide 30 is preferably formed by an in-situ steam generation (ISSG) process, the nitride layer 32 is formed by a thermal process, and the top oxide layer 34 is formed by a ISSG process or a thermal oxidation process. In this embodiment, the thickness of the first polysilicon layer 24 is approximately 1500 Angstroms, the thickness of the ONO stack 26 is approximately 170 Angstroms, and the thickness of the second polysilicon layer 28 is approximately 1500 Angstroms, but not limited thereto. As the formation of the gate patterns 16, 18, 20, 22 including a ONO stack 26 sandwiched between two polysilicon layers 24, 28 is well known to those skilled in the art, the details of which are not explained herein for the sake of brevity.

Next, a thermal process is performed to form an oxide layer 36 on each of the gate patterns 16, 18, 20, 22. Preferably, the oxide layer 36 is deposited to cover both the top surface of the gate patterns 16, 18, 20, 22 as well as the sidewall of the gate patterns 16, 18, 20, 22. After each of the gate patterns 16, 18, 20, 22 is covered by the oxide layer 36, a patterned resist 38 is formed on the gate patterns 16 and 18, or the patterns which will be formed into control gates afterwards.

Figure 2:
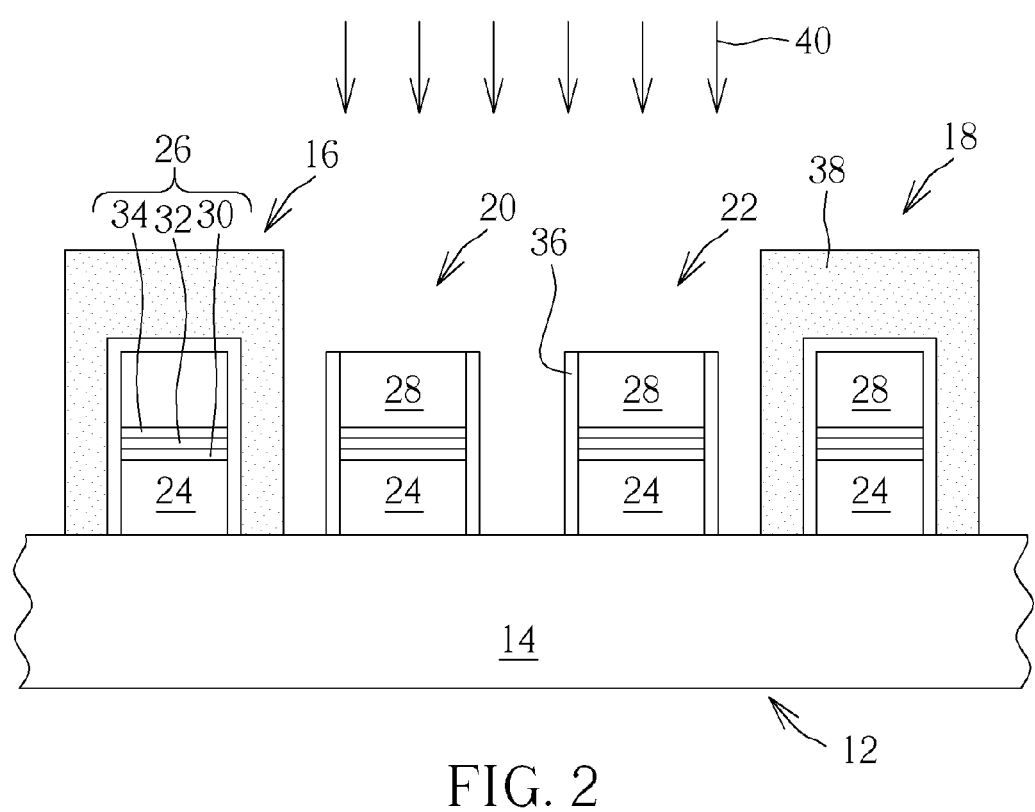

Next, as shown in FIG. 2, a first etching process 40 is conducted by using the patterned resist 38 as mask to remove part of the oxide layer 36 on the gate patterns 20 and 22. Preferably, the first etching process 40 is conducted to principally remove the oxide layer 36 situating atop the second polysilicon layer 28 while some of the oxide layer 36 is still remained on the sidewalls of the first polysilicon layer 24, ONO stack 26, and second polysilicon layer 28.

Figure 3:
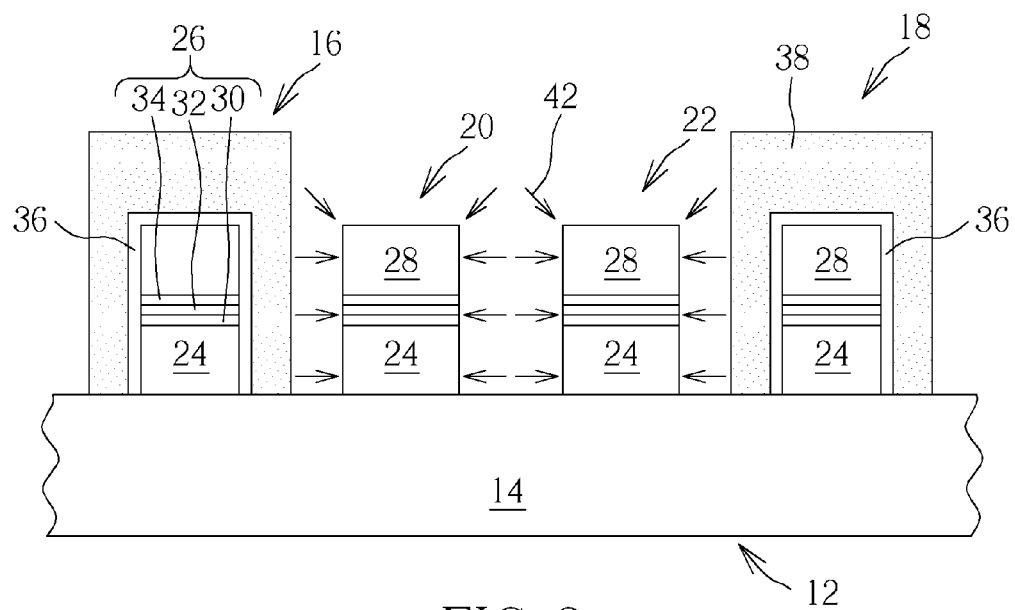

After removing part of the oxide layer 36, as shown in FIG. 3, a second etching process 42 is conducted thereafter to isotropically etch, or completely remove the remaining oxide layer 36 from the sidewalls of the first polysilicon layer 24, the ONO stack 26, and second polysilicon layer 28 so that the second polysilicon layer 28, the ONO stack 26, and the first polysilicon layer 24 of the gate patterns 20 and 22 are fully exposed.

According to a preferred embodiment of the present invention, both of the first etching process 40 and the second etching process 42 include a dry etching process, in which the first etching process 40 is preferably accomplished by utilizing $CF_4$ to remove part of the oxide layer 36 on top of the second polysilicon layer 28 while adjusting a bias RF voltage from 150V to 0V, whereas the second etching process 42 is accomplished utilizing $CF_4$ and $CHF_3$ to remove the remaining oxide layer 36 preferably from the sidewall of the gate patterns 20 and 22 at zero bias RF voltage.

It should be noted that since the pre-defined control gates, or the gate patterns 16 and 18 are covered by the patterned resist 38 during the first etching process 40 and second etching process 42, only the oxide layer 36 on the gate patterns 20 and 22 are removed by the aforementioned etching processes 40 and 42.

Figure 4:
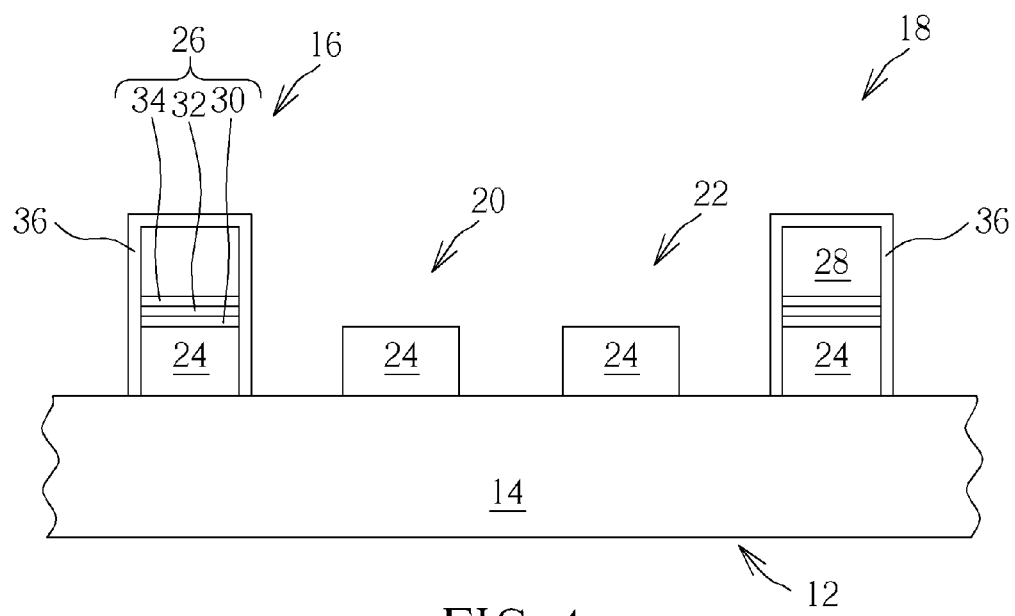

After the oxide layer 36 is completely removed from the gate patterns 20 and 22, as shown in FIG. 4, a third etching process is conducted to remove part of the second polysilicon layer 28, and a fourth etching process is conducted thereafter to remove the remaining second polysilicon layer 28. Subsequently, a fifth etching process is performed to remove the ONO stack 26 so that the first polysilicon layer 24 underneath is exposed. Preferably, each of the third etching process, the fourth etching process, and the fifth etching process is accomplished by a dry etching process, but not limited thereto.

Figure 5:
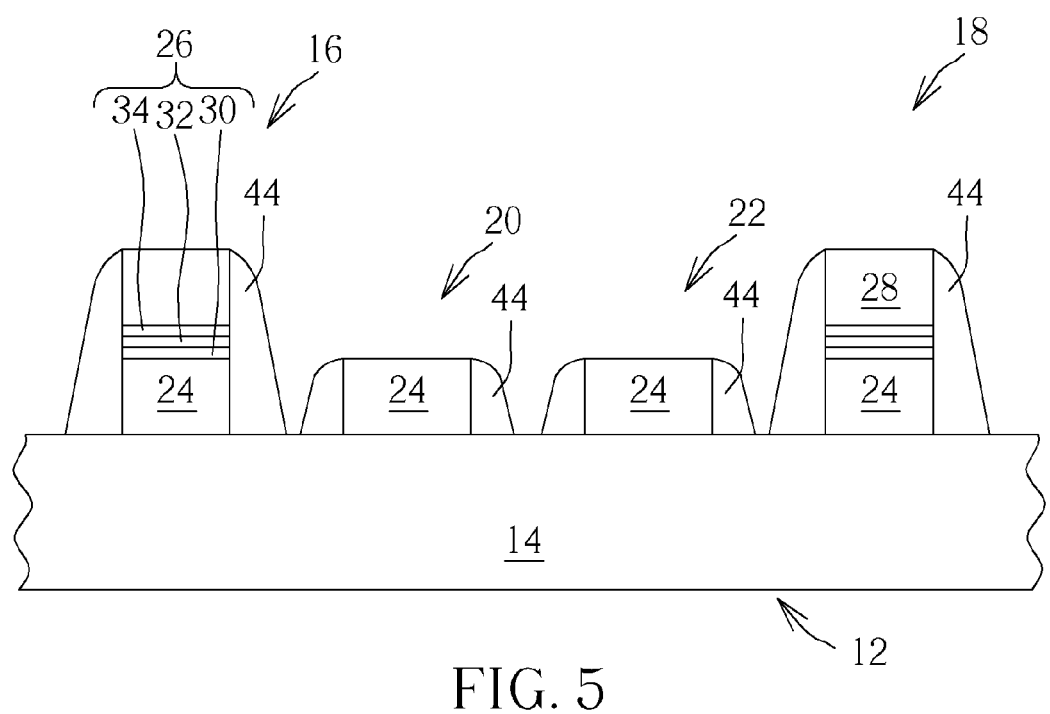

After the second polysilicon layer 28 and the ONO stack 26 are removed from the gate patterns 20 and 22, as shown in FIG. 5, the patterned resist 38 is stripped from the gate patterns 16 and 18 and the oxide layer 36 formed around the gate patterns 16 and 18 could be removed or retained. If the oxide layer 36 were to be removed, as shown in FIG. 5, the removal of the oxide layer 36 around the gate patterns 16 and 18 could be accomplished by using the aforementioned approach used for removing the oxide layer 36 around the gate patterns 20 and 22. For instance, a first dry etching process could be conducted by utilizing $CF_4$ while adjusting a bias RF voltage from 150V to 0V to remove part of the oxide layer 36 on top of the second polysilicon layer 28 of the gate patterns 16 and 18, and a second dry etching is conducted thereafter by using $CF_4$ and $CHF_3$ at zero bias RF voltage to remove the remaining oxide layer 36 from the sidewall of the gate patterns 16 and 18.

After removing the oxide layer 36, a spacer 44 is formed adjacent to each of the gate patterns 16, 18, 20, 22, source/drain regions (not shown) could be formed in the substrate 14, and silicide process could be performed to form silicides on top of the gate patterns 16, 18, 20, 22 thereafter. This forms a pair of control gates 16 and 18 and a pair of select gates 20 and 22 on the substrate 12 and completes the fabrication of a flash memory device according to a preferred embodiment of the present invention.

Overall, the present invention conducts two dry etching processes to completely remove the oxide layer formed around the predetermined gate patterns that will be formed into select gates thereafter. Preferably, the first dry etching process uses $CF_4$ to remove part of the oxide layer on top of the predetermined gate pattern while the second dry etching process utilizes CF4 and CHF3 to remove the remaining oxide layer from the sidewall of the gate pattern. By using this two-step dry etching scheme, the oxide layer covering the predetermined gate pattern used to be formed into select gates could be removed completely so that the silicides formed thereafter will be unaffected.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a non-volatile memory semiconductor device, comprising:
   providing a substrate;
   forming a gate pattern on the substrate, wherein the gate pattern comprises a first polysilicon layer on the substrate, an oxide-nitride-oxide (ONO) stack on the first polysilicon layer, and a second polysilicon layer on the ONO stack;
   forming an oxide layer on the top surface and sidewall of the gate pattern;
   performing a first etching process to remove part of the oxide layer; and
   performing a second etching process to completely remove the remaining oxide layer.

2. The method of claim 1, further comprising performing a thermal process for forming the oxide layer.

3. The method of claim 1, wherein the first etching process comprises a dry etching process.

4. The method of claim 1, wherein the second etching process comprises a dry etching process.

5. The method of claim 1, further comprising utilizing $CF_4$ for performing the first etching process.

6. The method of claim 1, further comprising utilizing $CF_4$ and $CHF_3$ for performing the second etching process.

7. The method of claim 1, wherein the first etching process comprises adjusting a bias RF voltage from 150V to 0V.

8. The method of claim 1, wherein the second etching process is performed at zero bias RF voltage.

9. The method of claim 1, further comprising performing the first etching process after utilizing a patterned resist for defining the gate pattern into a select gate.

10. The method of claim 1, further comprising performing a third etching process for removing part of the second polysilicon layer after completely removing the remaining oxide layer.

11. The method of claim 10, further comprising performing a fourth etching process for removing the remaining second polysilicon layer.

12. The method of claim 1, further comprising performing a fifth etching process for removing the ONO stack.

13. The method of claim 1, wherein the ONO stack comprises a bottom oxide layer, a nitride layer and a top oxide layer.

14. The method of claim 13, wherein the bottom oxide layer is formed by an in-situ steam generation (ISSG) process.

15. The method of claim 13, wherein the nitride layer is formed by a thermal process.

16. The method of claim 13, wherein the top oxide layer is formed by an in-situ steam generation (ISSG) process or a thermal oxidation process.

* * * * *